(12) United States Patent
Chou

(10) Patent No.: US 6,424,574 B1
(45) Date of Patent: Jul. 23, 2002

(54) METHOD USING MULTIPLE ERASING PROCESSES TO INCREASE USING TIMES OF A FLASH MEMORY

(75) Inventor: Kuo-Yu Chou, Hsin-Chu Hsien (TW)

(73) Assignee: AMIC Technology (Taiwan) Inc., Hsin-Chu Hsien (TW)

( * ) Notice: Subject to any disclaimer, the term of this patent is extended or adjusted under 35 U.S.C. 154(b) by 0 days.

(21) Appl. No.: 09/865,565

(22) Filed: May 29, 2001

(30) Foreign Application Priority Data

Mar. 9, 2001 (TW) ...................................... 090105623 A

(51) Int. Cl.⁷ .............................................. G11C 16/00
(52) U.S. Cl. ............................. 365/185.29; 365/185.29
(58) Field of Search ........................ 365/185.29, 185.3, 365/185.22

(56) References Cited

U.S. PATENT DOCUMENTS 5,530,669 A * 6/1996 Oyama ................... 365/185.29
6,091,642 A * 7/2000 Pasotti et al. ........... 365/185.29

* cited by examiner

*Primary Examiner*—Tan T. Nguyen
(74) *Attorney, Agent, or Firm*—Winston Hsu

(57) ABSTRACT

The present invention provides a method of erasing data in a flash memory. The flash memory has a number of memory units for storing data. The method has involves repeatedly performing an erasing process along a first erasing route to erase data stored in each memory unit, and if after a predetermined number of erasing times, data in each memory unit is not completely erased, a second erasing route to perform the erasing process is utilized.

15 Claims, 3 Drawing Sheets

METHOD USING MULTIPLE ERASING PROCESSES TO INCREASE USING TIMES OF A FLASH MEMORY

BACKGROUND OF THE INVENTION

1. Field of the Invention

The present invention relates to a method of erasing data in a flash memory, and more particularly, to a method of respectively using a different erasing route to increase lifetime of the flash memory when erasing data.

2. Description of the Prior Art

In the modern information society, communicating mass information has become a regular part of life. To manage information efficiently, memory devices to access information have also become an area of development. Especially, flash memory with its advantages of low power consumption, high-speed operation, being readable/writable, non-volatile, and having no mechanical operations.

Flash memory comprises a plurality of memory units with each memory unit comprising a specially made MOS (Metal-Oxide-Semiconductor) transistor for storing bit digital data. Please refer to FIG. 1 of a diagram of a transistor 10 in a typical flash memory unit. In the transistor 10, an oxidative layer 16 of the transistor 10 further comprises a floating gate 14 barring a normal gate 12, a drain 18, a source 20, an oxidative layer 16, and a substrate 22. Although the detailed structure and physical mechanism differ with each kind of flash memory units, generally, when the flash memory operates(i.e. stores data), it injects an electric charge(usually, electrons) into the floating gate to change the threshold voltage of the transistor 10. The value of the threshold voltage represents the stored data in the memory unit corresponding to the transistor 10 is either 1 or 0.

To program new data into the flash memory, the original stored data in the flash memory has to be erased(i.e. the electric charges of the floating gate in each memory unit transistor are erased). If old data in the flash memory is not erased completely, remaining electric charges affect the threshold voltage, so programming new data correctly is unreliable. To ensure that old data is completely erased, a standard method is used. Please refer to FIG. 2 of a flow chart of an entire erasing process 30 in a prior art erasing method. The prior art erasing process 30 comprises:

Step 32: Start the entire erasing process. Set a value of a counter N to 0. Inject electric charges into the floating gates of all memory units to perform follow-up erasing steps.

Step 36: Perform the erasing process. The erasing process further comprises:

Step 38: Remove electric charges from the floating gate 12 along a fixed route.

Step 40: Verify whether the electric charges are completely removed from the floating gate of each transistor 10. Usually this step is performed by measuring the threshold voltage of the transistor 10. If the electric charges has been completely removed (or the remaining electric charges are lower than a tolerance), then the verification passes, and move on to step 42. If the verification is not successful, go to step 44.

Step 42: End of the erasing process 30.

Step 44: If erasing incomplete increase the counter N by 1 (N is the number of verification failures).

Step 46: Verify whether the value of the counter N is bigger than a default value Nf. If yes, the number of verification failures is too many, and the old data in the flash memory is incapable of being erased completely. If the value of the counter N is less than a default value Nf, another erasing process needs to be performed.

Step 48: A warning signal displays that the old data in the flash memory is not capable of being erased completely.

When performing the prior art erasing process, the electric charges in the floating gate 14 are removed along a fixed route in the transistor 10. Three routes are marked in FIG. 1, the three possible routes respectively are: Route 24 which is from the floating gate 14 to the channel, Route 26 which is from the floating gate 26 to the source 20, and Route 28 which is from the floating gate 14 to the drain 18. In the prior art erasing process, the electric charges in the floating gate 14 are moved out from the floating gate 14 along a fixed default route (using one of the above three possible routes). Since the floating gate is located at the oxidative layer 16, when the electric charges are moved out from the floating gate, the electric charges pass through the oxidative layer 16. After the flash memory erases data along a same route several times (when programming new data), the oxidative layer 16 on the route suffers damage and traps are produced, so that the electric charges sink into them and become trapped. By increasing the number of electric charges sinking into the oxidative layer 16 of the erasing route, the electric charges in the floating gate are more difficult to remove through this route. A saturation point occurs when the electric charges cannot be moved out via the route, and the prior art erasing method becomes inefficient and inadequate.

SUMMARY IF THE INVENTION

It is therefore a primary objective of the present invention to provide an erasing method of removing electric charges along different routes to erase old data to solve the above mentioned problems.

In a preferred embodiment, the present invention provides a method of erasing data in a flash memory. The flash memory comprises a plurality of memory units for storing data. The method comprises repeatedly performing an erasing process along a erasing route to erase data stored in each memory unit; and if after a predetermined number of erasing times, data in each memory unit is not completely erased, a second erasing route is utilized to perform the erasing process.

It is an advantage of the present invention that the erasing method can increase the endurance of the flash memory.

These and other objectives and advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

As mentioned, transistors in a flash memory unit for storing data have a plurality of workable erasing routes to remove electric charges from the floating gate. The prior erasing method only uses a fixed erasing route resulting in a reduction in the endurance of the device. To solve the problems of the prior art, the present invention erasing method uses different erasing routes. Eventhough one of the erasing routes cannot remove electric charges completely, the present invention erasing method employs another erasing route to remove the electric charges from the floating gate.

Figure 1:
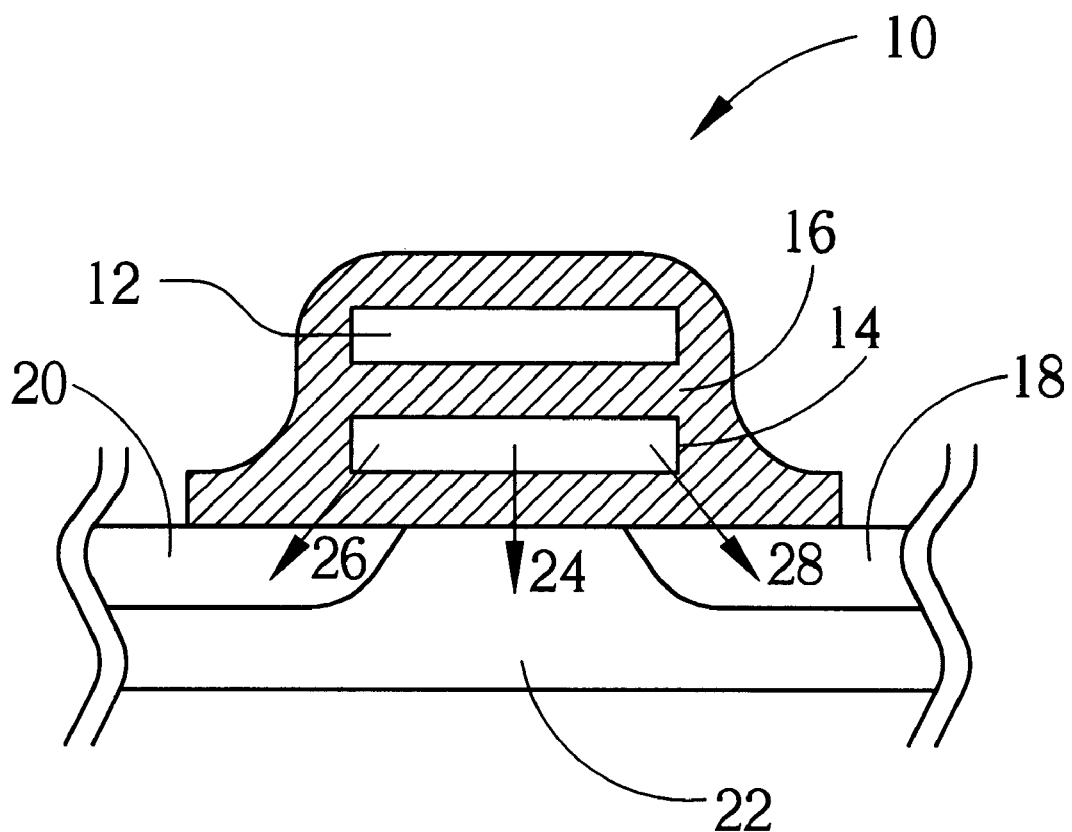
FIG. 1 is a diagram of a transistor in a flash memory unit.
Figure 2:
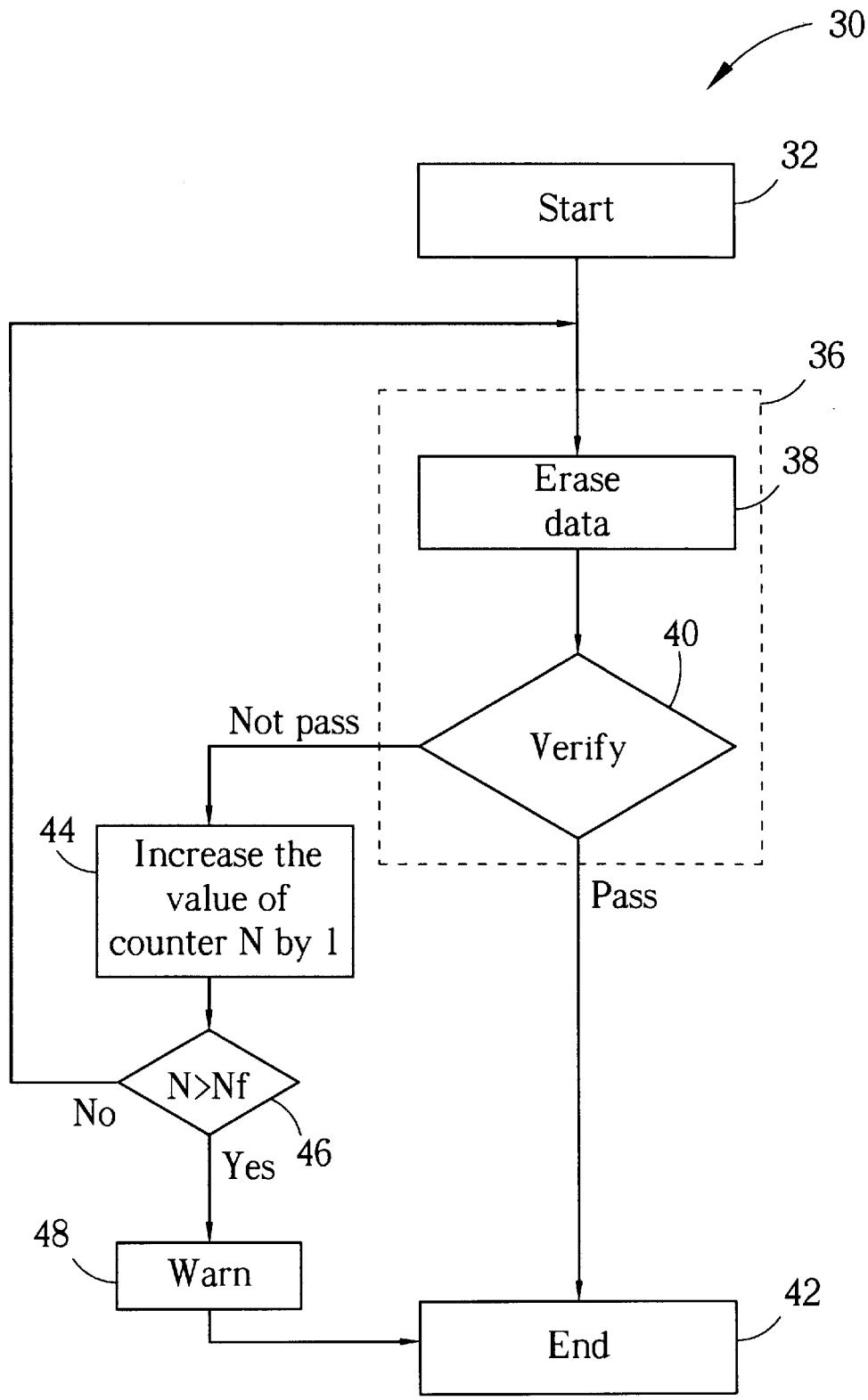
FIG. 2 is a flow chart of a prior art erasing method.
Figure 3:
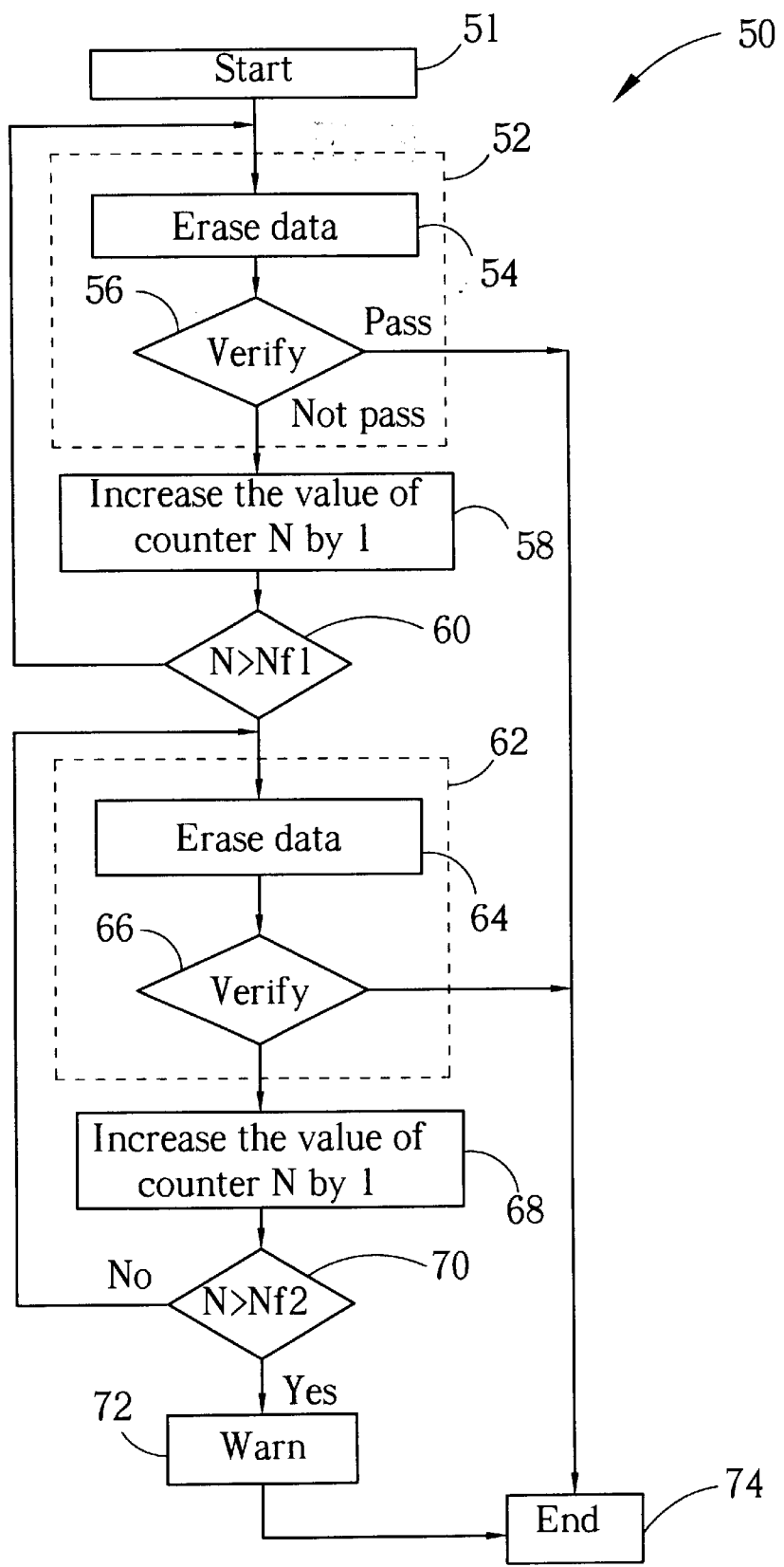
FIG. 3 is a flow chart of the present invention erasing method.

Please refer to FIG. 3 of a flow chart of the present invention erasing method. Without restricting the expanse of the art, the flow chart in FIG. 3 assumes that the present invention is applied on a flash memory in a memory unit with two erasing routes. Of course, the present invention method can be applied on a flash memory in a memory unit with more than one erasing route. Besides, the present invention erasing method can be applied on flash memory with different structures, such as a transistor structure in a memory unit as shown in FIG. 1, or flash memory made of split gate Metal-Oxide-Semiconductor transistors. In spite of different structures or physical mechanisms between each kind of flash memory, the present invention erasing method can be applied to achieve the objective of extending the lifetime of the flash memory as long as erasing the flash memory utilizes erasing routes.

As shown in FIG. 3 of a flow chart of performing an erasing process 50 of the present invention erasing method (applying in a preferred embodiment of the flash memory with two erasing routes). The spirit of the present invention comprises initially performing an erasing process along a default erasing route to remove the electric charges from the floating gate. If the number of charges in the erasing process along this erasing route exceeds a predetermined value but does not pass the verification, it may mean that the oxidative layer of the route is damaged, or it is not proper to perform the erasing process along the route. The present invention erasing process then uses another erasing route to continue performing the erasing process to remove the electric charges. The present invention erasing method comprises:

Step 51: Start the whole erasing process. Set a value of a counter N to 0. In this step, another step can be added optionally: injecting the electric charges into the floating gate. It can balance the status of each memory unit in the flash memory.

Step 52: Along a default erasing route (this is the first route chosen, for example, the default erasing route can be the erasing route 24 in FIG. 1), perform an erasing process. The erasing process comprises the following steps:

Step 54: Erase data in each memory unit, i.e. remove the electric charges in the floating gate along the default first erasing route. Usually, this step comprises adding a voltage on different electrodes of the memory unit transistor to produce an electric field so that electric charges tunnel through the oxidative layer of the transistor along the first erasing route.

Step 56: Verify whether the data in the memory unit is erased completely. Usually, this step is performed by supplying a predetermined gate voltage to the gate of the transistor in the memory unit to test the current through the transistor, then whether the electric charges left in the floating gate are lower than a predetermined tolerance value can be decided. If the memory unit passes the verification, it means that the old data is erased completely; then move to step 74. If the verification does not pass, go to step 58.

Step 58: If verification failure occurs, meaning the device is not completely erased the counter N is incremented by 1, registering the number of verification failures.

Step 60: Check whether the value of the counter N (i.e. the number of the verification failure) is bigger than a default value Nf1. If not, then repeat Step 52, and perform the erasing process along the first route. If the counter N is greater than Nf1, it means that the number of the verification failures occurring due to repeatedly performing the erasing process 52 along the first route is too many. The first route may be damaged to a certain degree, and it is not suitable for erasing data along the first erasing route. At this time, the present invention erasing method continues to perform Step 62 to remove the electric charges from the floating gate along another erasing route to erase data. Please note that in the prior art erasing method, when the value N is greater than a default value Nf, the flash memory is defined as being beyond use. In fact, as the present invention discloses, as long as data is continuously completely erased along another erasing route, the flash memory is still capable of working properly.

Step 62: Moving from step 60 to this step means that data stored in the transistor cannot be completely erased along the first erasing route. Therefore, in this step, the erasing process is performed along another erasing route (called the second erasing route in the following disclosure). This second erasing route can be, for example, the erasing route 26 in FIG. 1. Basically, except for the fact that the erasing route is different, the objective of Step 62 and Step 52 are the same, in that these steps perform the erasing process to remove the electric charges from the floating gate and erase data in the memory unit. Therefore, similarities exist with Step 54 and 56 in Step 52, Step 62 and Step 64 (erasing data along the second erasing route) and Step 66 (verifying whether data is completely erased).

For the present invention the steps are repeated until data is completed erased, or data cannot be completely removed along the different erasing routes.

The verification steps in Step 56 and Step 66 may further comprise a depletion verification (to test whether over-erase occurs) and suitable compensation (such as soft program). If after compensation, data is still remaining, corresponding warning signals flag this. The detailed art of depletion verify and compensation (and its application) is prior art, but does not affect the disclosure of the present invention art, so it is unnecessary to give details. Step 74 ends the erasing process of the present invention erasing method.

Although the above preferred embodiment uses the flash memory with two erasing routes as an example, the present invention can easily be applied to a flash memory with more erasing routes. Please refer to FIG. 3, in which Step 52 (and Step 54 and 56), Step 58, and Step 60 form a group associated with the erasing process along the first erasing route. Step 62 (and Step 64 and 66), Step 68, and Step 70 associated with the erasing process along the second erasing route to form the second group. If there is a third erasing route used, another step similar to the two groups of steps between Step 70 and Step 72 to perform the erasing process and associated steps along the third erasing route, needs to be added. Finally, please note that in Step 60 and Step 70, two default values Nf1 and Nf2 are respectively set. Since the counter N starts to increase from 0 when the erasing process starts (Step 51), and it does not reset until end (Step 74), the default value Nf2 may be bigger than Nf1 to respond to the result of increasing the counter N. For example, if the maximum number of times of the erasing process along the first erasing route is set at 5,000, and the maximum number of times of the erasing process along the second erasing route is set to 4,000, the default value Nf1 should be 5,000, and the default value Nf2 should be 9,000 (5,000 plus 4,000).

The flash memory often uses a fixed amount of memory units as a whole (such as a word, a block, or a page) to perform the erasing process. Of course, the present invention erasing method can also be applied to these and use respective erasing routes in these memory units to perform the erasing perform. The objective of extending the lifetime of the flash memory is also achieved.

In the contrast to the prior art method of using a single erasing route to perform the erasing process, the present invention erasing method uses respective erasing routes to perform the erasing process. The lifetime of the flash memory can be substantially increased, and the advantage of the present invention is therefore proved.

Those skilled in the art readily observe that numerous modifications and alterations of the device may be made while retaining the teachings of the invention. Accordingly, the above disclosure should be construed as limited only by the metes and bounds of the appended claims.

What is claimed is:

1. A method of erasing data in a flash memory, the flash memory comprising a plurality of memory units for storing data, the method comprising:

repeatedly performing an erasing process along a first erasing route to erase data stored in each memory unit; and if after a predetermined number of erasing times data in each memory unit is not completely erased, utilizing a second erasing route to perform the erasing process.

2. The method of claim 1 wherein the erasing process further comprises verifying whether data in each memory unit is completely erased.

3. The method of claim 1 wherein each memory unit comprises a Metal-Oxide-Semiconductor transistor, the transistor comprising a floating gate for storing electric charge to change a threshold voltage of the transistor.

4. The method of claim 3 wherein the erasing process further comprises a depletion verification.

5. The method of claim 3 wherein the data stored in the memory unit is determined by a value of the threshold voltage.

6. The method of claim 3 wherein the electric charge in the floating gate moves out of the floating gate along the first erasing route or the second erasing route to erase data stored in the memory unit.

7. The method of claim 3 wherein the first erasing route or the second erasing route is through the floating gate of the transistor to a source of the transistor.

8. The method of claim 3 wherein the first erasing route or the second erasing route is through the floating gate of the transistor to a drain of the transistor.

9. The method of claim 3 wherein the first erasing route or the second erasing route is through the floating gate of the transistor to a channel of the transistor.

10. A method of erasing data in a flash memory, the flash memory comprising a plurality of memory units for storing data, each memory unit comprising a Metal-Oxide-Semiconductor transistor, the transistor comprising a floating gate for storing electric charge, data stored in each memory unit being related to the electric charge in the floating gate of the memory unit, the method comprising:

repeatedly performing an erasing process along a first erasing route to remove the electric charge in each floating gate to erase data stored in the corresponding memory unit; and if after a predetermined number of erasing times data in each memory unit is not completely erased, utilizing a second predetermined erasing route to perform the erasing process.

11. The method of claim 10 wherein the erasing process further comprises verifying whether data in each memory unit is completely erased.

12. The method of claim 10 wherein the erasing process further comprises a depletion verification.

13. The method of claim 10 wherein the first erasing route or the second erasing route is through the floating gate of the transistor to a source of the transistor.

14. The method of claim 10 wherein the first erasing route or the second erasing route is through the floating gate of the transistor to a drain of the transistor.

15. The method of claim 10 wherein the first erasing route or the second erasing route is through the floating gate of the transistor to a channel of the transistor.

* * * * *